(12) United States Patent
Yoshida (10) Patent No.: US 6,239,581 B1
(45) Date of Patent: May 29, 2001

(54) BATTERY STATE MONITORING CIRCUIT AND BATTERY DEVICE

(75) Inventor: Shinichi Yoshida, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 09/450,158

(22) Filed: Nov. 29, 1999

(51) Int. Cl.[7] .................................................. H01M 10/46
(52) U.S. Cl. ............................................................ 320/162
(58) Field of Search ................................... 320/132, 135, 320/157, 159, 162, DIG. 21

(56) References Cited

U.S. PATENT DOCUMENTS 5,469,071 * 11/1995 Obata .

* cited by examiner

Primary Examiner—Edward H. Tso (74) Attorney, Agent, or Firm—Adams & Wilks (57) ABSTRACT

A battery pack has a rechargeable power source, external connection terminals for connecting the power source to at least one of a load and a charger, a switching element for terminating a current flowing in the power source and a battery state monitoring circuit for detecting at least one of a voltage and a current of the power source and producing a corresponding output signal. The battery state monitoring circuit has an overcurrent detection circuit for detecting an overcurrent state of the power source and controlling the switching element to terminate current flow in the power source when an overcurrent state is detected. The overcurrent detection circuit comprises a sense resistor not formed of a transistor element connected in series with the power source for producing a voltage drop thereacross proportional to the current in the power source, and a comparator for comparing the voltage drop across the resistor to a reference voltage and producing a comparison output signal, wherein the reference voltage is set to a value at which the voltage drop across the resistor indicates an overcharge state of the power source.

11 Claims, 7 Drawing Sheets

|  | SENCE RESISTOR | ON-RESISTOR OF SWICHING ELEMENT |
|---|---|---|
| FLUCTUATION IN MANUFACTURE | MAX ±5% | ABOUT ±30% |
| (GATE) VOLTAGE DEPENDENCY | NO | YES |
| TEMPERATURE COEFFICIENT | ABOUT 300 ppm/°C | ABOUT 1000 ppm/°C |

BATTERY STATE MONITORING CIRCUIT AND BATTERY DEVICE

BACKGROUND OF THE INVENTION

1. Field of the Invention

The present invention relates to a battery device (hereinafter referred to as "battery pack") including a circuit for which the monitoring of a battery state such as a voltage across a secondary battery or a charging or discharging current is required, a battery state monitoring circuit, an external connection terminal to the exterior of the battery device, a switching element, the secondary battery and a sense resistor.

Also, the present invention relates to a battery state monitoring circuit and a battery device which have a high accuracy in detecting an over-current and controls which the discharge current by detection of a voltage between both ends of the sense resistor.

2. Description of the Related Art

Figure 2:
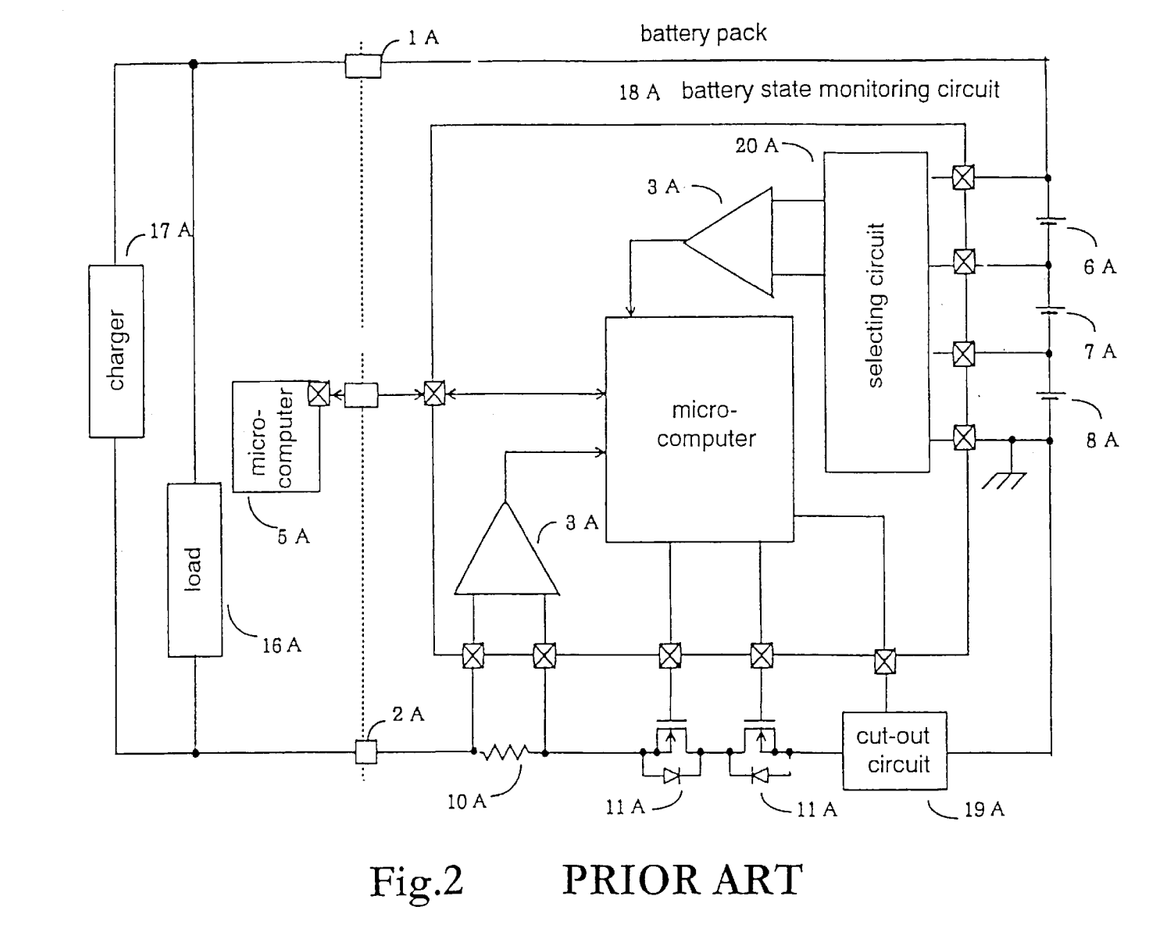
FIG. 2 is a structural circuit diagram showing a battery state monitoring circuit and a battery device in accordance with the prior art.

As a conventional battery state monitoring circuit, there has been known a device shown in a circuit block diagram of FIG. 2. The structure of this type is disclosed, for example, in Japanese Patent Unexamined Publication No Hei 9-312172, "A battery pack, a charger and a charging system as well as a charging method". This publication relates to a battery pack which is called a "smart battery system" or the like. In other words, this is a battery pack having a function of monitoring a voltage across a secondary battery or a charging or discharging current by use of a microcomputer and which conducts communication with a load such as the charger or the computer.

The use of the battery pack thus structured makes it possible to recognize the battery state through communication with a charger, a microcomputer within a personal computer, a load or the like. By use of this information, the display of a remaining capacity of the battery, the termination of charging and discharging and so on are accurately conducted.

FIG. 2 shows a conventional battery state monitoring circuit 18A and a conventional battery device which is made up of at least an external terminal made up of a plus terminal 1A and a minus terminal 2A which connect the battery state monitoring circuit 18A, a charger and so on, and a switching element 11A that controls a discharge current. In the conventional battery state monitoring circuit 18A and the conventional battery device, a voltage Vd between both ends of the switching element 11A (for example, MOS-FET) is detected by a microcomputer to turn off the switching element 11A so that charging batteries 6A to 8A are prevented from allowing an excessive current to flow. Reference 3A denotes an operational amplifier; 5A, a microcomputer for calculating the remaining capacity of the charging batteries 6A to 8A through communication with the battery state monitoring circuit 18A; 16A, a load connected to the battery device; 17A, a charger connected to the battery device; 19A, a cut-out circuit for cutting out charging/discharging current paths of the charging batteries 6A to 8A by the battery state monitoring circuit 18A; and 20A, a selecting circuit for determining which battery is selected among the charging batteries 6A to 8A.

The conventional battery state monitoring circuit 18A and the conventional battery device suffer from a problem in that accuracy of over-current detection is low because the on-resistance (a resistor during energization) of the switching element 11A (for example, a MOS-FET) has a fluctuation in manufacture, and a (gate) voltage dependency, a temperature characteristic and so on are low.

According to the present invention, there is provided a battery state monitoring circuit and a battery device for detecting an over-current by detecting a voltage between both ends of a sense resistor. Further, provision of means for holding an over-current detection signal allows prevention of the oscillation of a switching element.

SUMMARY OF THE INVENTION

The present invention has been made in view of the above, and therefore an object of the present invention is to detect an over-current by using a sense resistor and detecting a voltage between both ends of the sense resistor.

BRIEF DESCRIPTION OF THE DRAWINGS

These and other objects, features and advantages of this invention will become more fully apparent from the following detailed description taken with the accompanying drawings in which.

DETAILED DESCRIPTION OF THE PREFERRED EMBODIMENTS

Now, a description will be given in more detail of preferred embodiments of the present invention with reference to the accompanying drawings.

Figure 1:
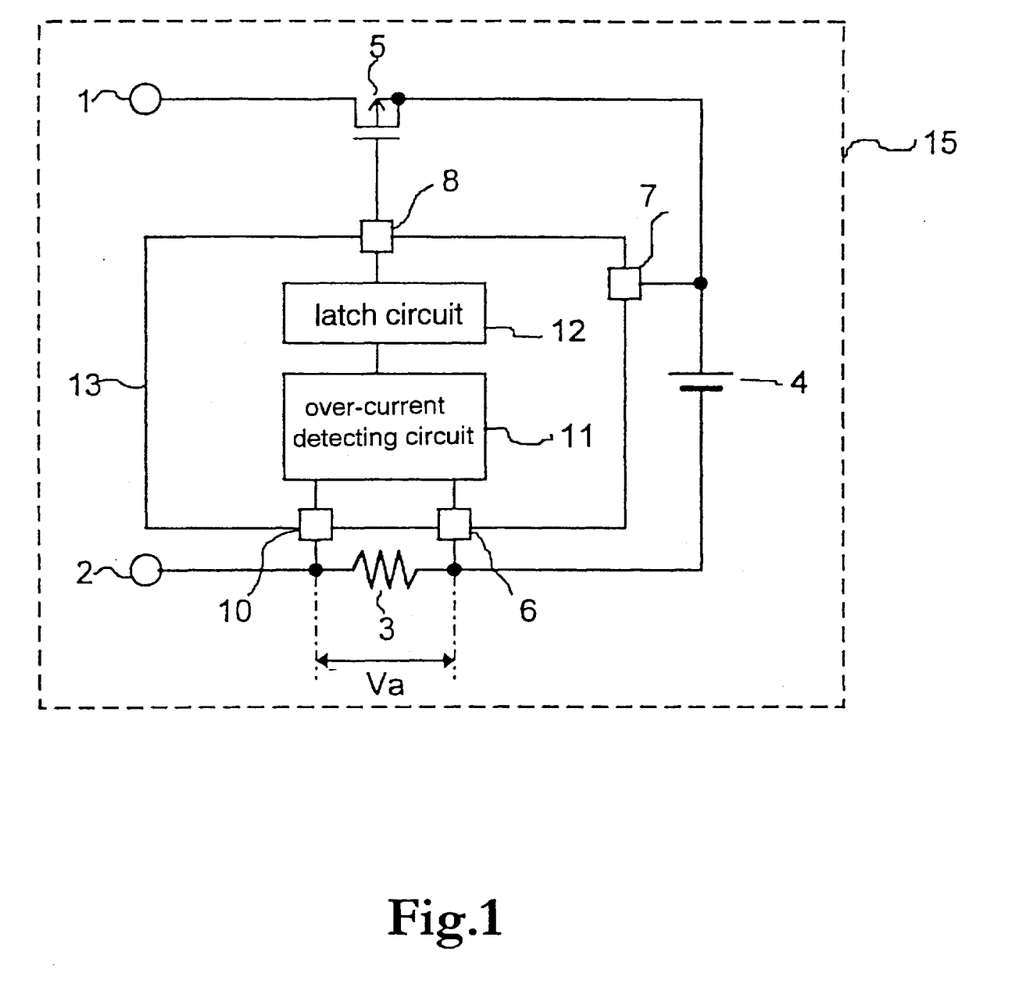
FIG. 1 is a structural circuit diagram showing a battery state monitoring circuit and a battery device in accordance with the present invention.

FIG. 1 shows a battery state monitoring circuit 13 and a battery device 15 in accordance with the present invention. When a voltage Va between both ends of a sense resistor 3 exceeds a desired value (over-current detection voltage), an output of an over-current detecting circuit 11 is inverted. This is called "detection of the over-current detecting circuit 11", a signal from the over-current detecting circuit 11 at the time of detection is called a "detection signal", and a circuit that delays only the detection operation is called a "detection delay circuit". The detection signal permits the switching element 5 to turn off, thereby preventing a charging battery 4 from allowing an excessive current to flow. Since a current that flows in the sense resistor 3 becomes zero after the switching element 5 turns off, an output signal of the over-current detecting circuit 11 is inverted, and the over-current detecting circuit 11 outputs the same voltage as that when the voltage Va between both ends of the sense resistor 3 is zero. This is called the "release of the over-current detecting circuit 11", a signal from the over-current detecting circuit at that time is called a "release signal", and a circuit for delaying only the release operation is called a "release delay circuit". Since the over-current detecting circuit 11 will turn on the switching element 5 again when a current that flows in the sense resistor 3 becomes zero, a latch circuit 12 is provided to hold the detection signal, thus preventing the on/off operation of the switching element 5 from being repeated.

The over-current detecting circuit 11 in FIG. 1 is a whole means for changing an output voltage when the voltage Va between both ends of the sense resistor 3 exceeds a desired value (for example, 0.2 V), and the present invention is not limited by or to the structural elements of the over-current detecting circuit 11.

Also, the latch circuit 12 in FIG. 1 is a whole means for holding an output signal of the over-current detecting circuit 11 when the voltage Va between both ends of the sense resistor 3 exceeds a desired value (for example, 0.2 V), and the present invention is not limited by or to the structural elements of the latch circuit 12.

In the embodiment shown in FIG. 1, a Pch-MOS-FET is used for the switching element 5 which is disposed at the plus electrode side of the charging battery 4, and the sense resistor 3 is disposed at the minus electrode side of the charging battery 4. Alternatively, an Nch-MOS-FET may be used for the switching element 5 which is disposed at the minus electrode side of the charging battery 4, and the sense resistor 3 in that case would be disposed at the plus electrode side of the charging battery 4. Also, no detection delay circuit is provided in the embodiment of FIG. 1, however, a detection delay circuit may be provided. In addition, in the embodiment of FIG. 1, only one switching element 5 is provided for controlling the discharge current. However, there may be a plurality of other switching elements for controlling the charging operation, etc.

Figure 3:
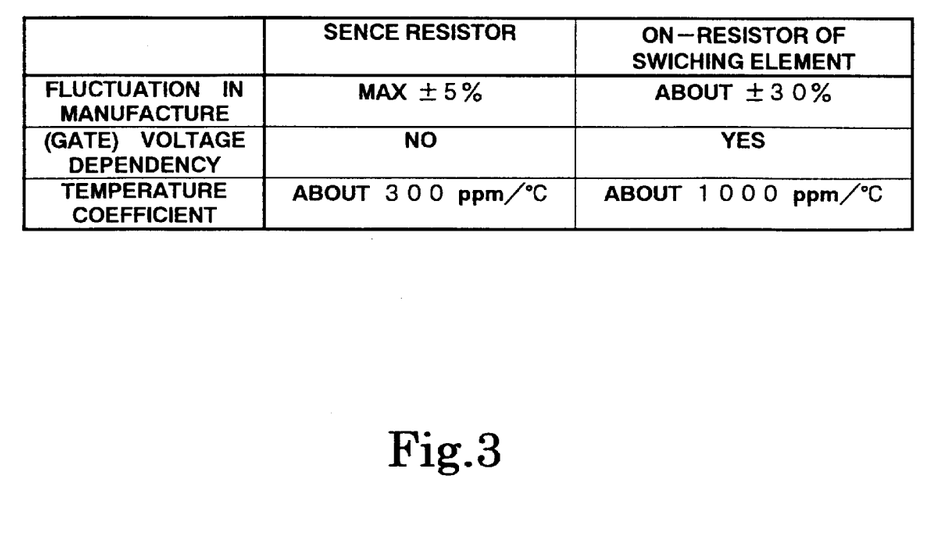
FIG. 3 is a diagram showing a comparison of a sense resistor and the on-resistance of a switching element (for example, a MOS-FET)

FIG. 3 shows a comparison of a sense resistor and the on-resistance of a switching element (for example, a MOS-FET). The sense resistor has a fluctuation in manufacture within 5% whereas the manufacturing fluctuation of the on-resistance of the switching element (for example, MOS-FET) is about 30% which is large. In addition, the sense resistor has no (gate) voltage dependency whereas the on-resistance of the switching element (for example, MOS-FET) has a (gate) voltage dependency. Comparing the temperature coefficient, the sense resistor is about 300 ppm/° C. whereas the on-resistance of the switching element (for example, a MOS-FET) is about 10,000 ppm/C which is about 30 times as large as that of the sense resistor. In view of the above, the use of the sense resistor for detection of the over-current is higher in accuracy than the use of the on-resistance of the switching element (for example, a MOS-FET).

Figure 4:
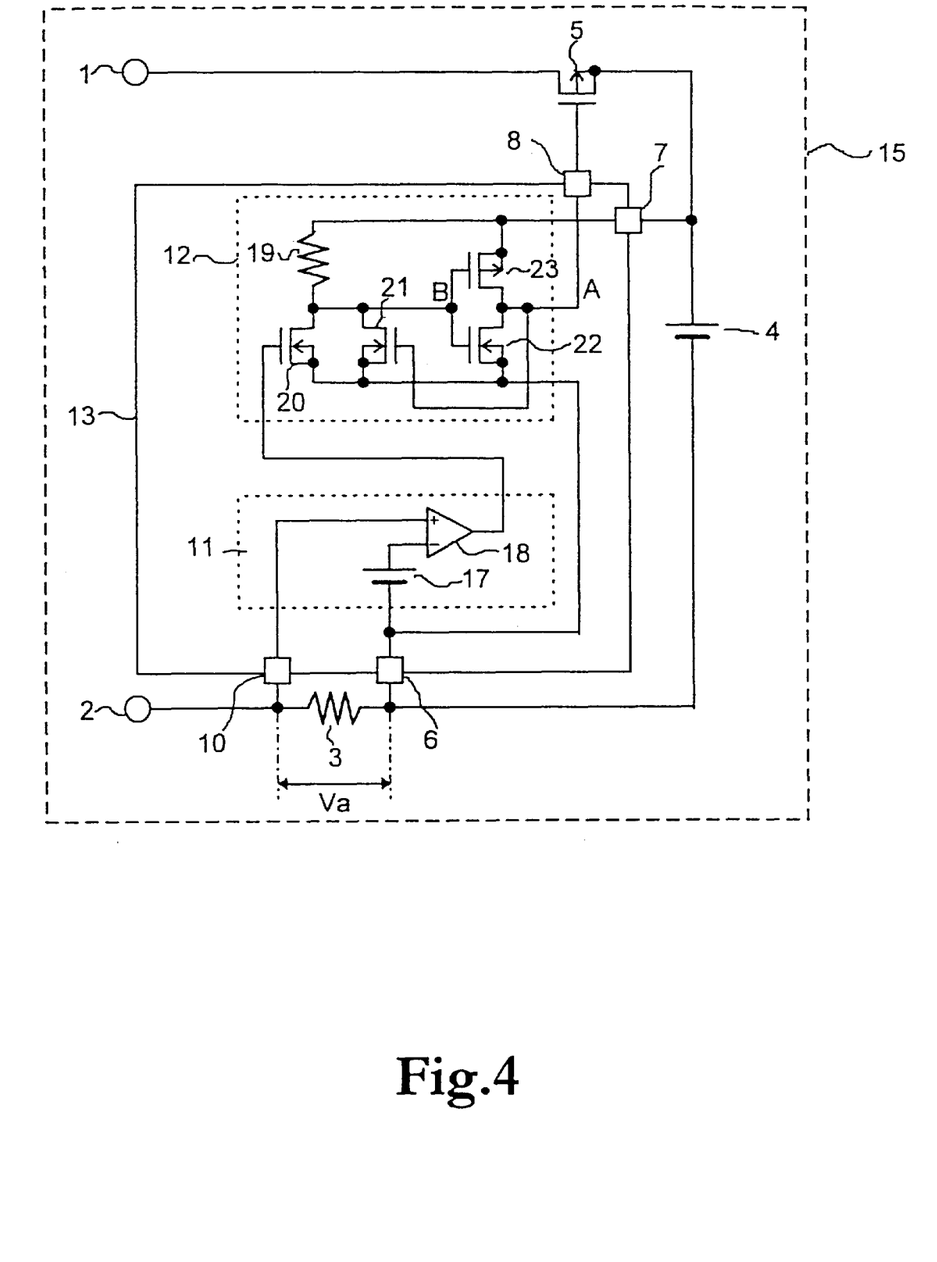
FIG. 4 is a structural circuit diagram showing a battery state monitoring circuit and a battery device which embody a detecting circuit and a latch circuit in accordance with the present invention.
Figure 5:
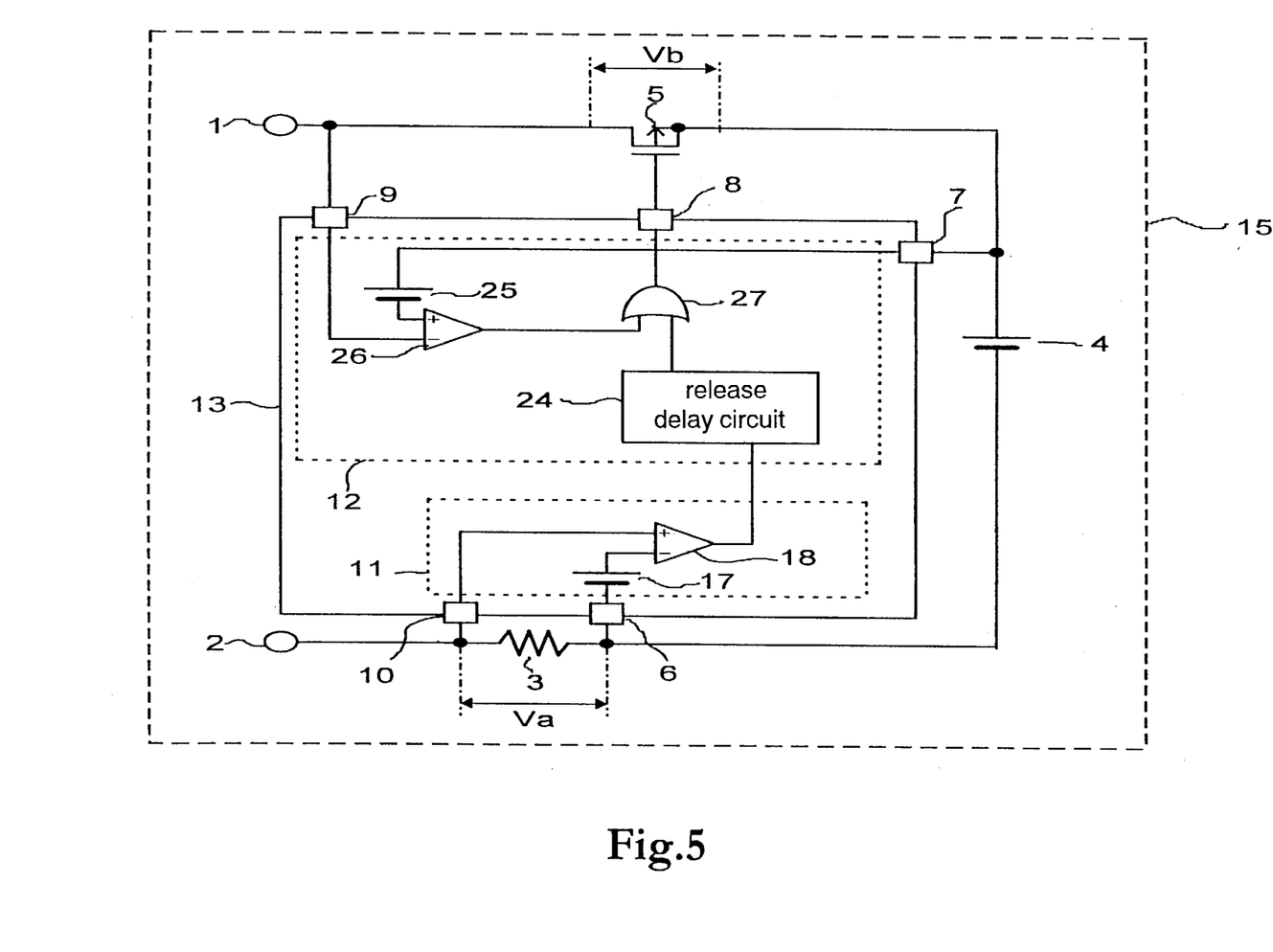
FIG. 5 is a structural circuit diagram showing a battery state monitoring circuit and a battery device which embody a detecting circuit and a latch circuit in accordance with the present invention.

FIGS. 4 and 5 show specific examples of the detecting circuit and the latch circuit shown in FIG. 1. The over-current detecting circuit 11 shown in FIGS. 4 and 5 is made up of a reference voltage 17 and a comparator 18, and when the voltage Va between both ends of the sense resistor 3 exceeds the reference voltage 17, the output of the comparator 18 is inverted, to thereby turn off the switching element 5.

The latch circuit 12 shown in FIG. 4 is made up of a transistor 20 and a resistor 19 (or a constant-current source), which feeds a signal A to the switching element 5 back to the gate of a transistor 21 and holds an input voltage B of an inverter that is made up of a transistor 22 and a transistor 23, low, to thereby hold the signal A to the switching element 5, high.

The latch circuit 12 shown in FIG. 5 is made up of a release delay circuit 24, a reference voltage 25, a comparator 26 and an OR circuit 27, and detects the turn-off of the switching element 5 through the comparator 26 and holds the off-state of the switching element 5 in response to the detection signal of the comparator 26.

The state that the switching element 5 turns off is judged by the fact that the voltage Vb between both ends of the switching element 5 exceeds the reference voltage 25. The over-current detection is conducted when the voltage Va between both ends of the sense resistor 3 exceeds the reference voltage 17, and the holding of the output signal from the detecting circuit 11 is conducted by judging that the switching element 5 turns off through the comparator 26. Because a time lag occurs until the comparator 26 detects the turn-off of the switching element 5 since the switching element 5 turns off, a release delay circuit 24 is provided at the output of the detecting circuit 11 so that a detection signal is held until the comparator 26 detects the turn-off of the switching element 5 since the switching element 5 turns off.

Figure 6:
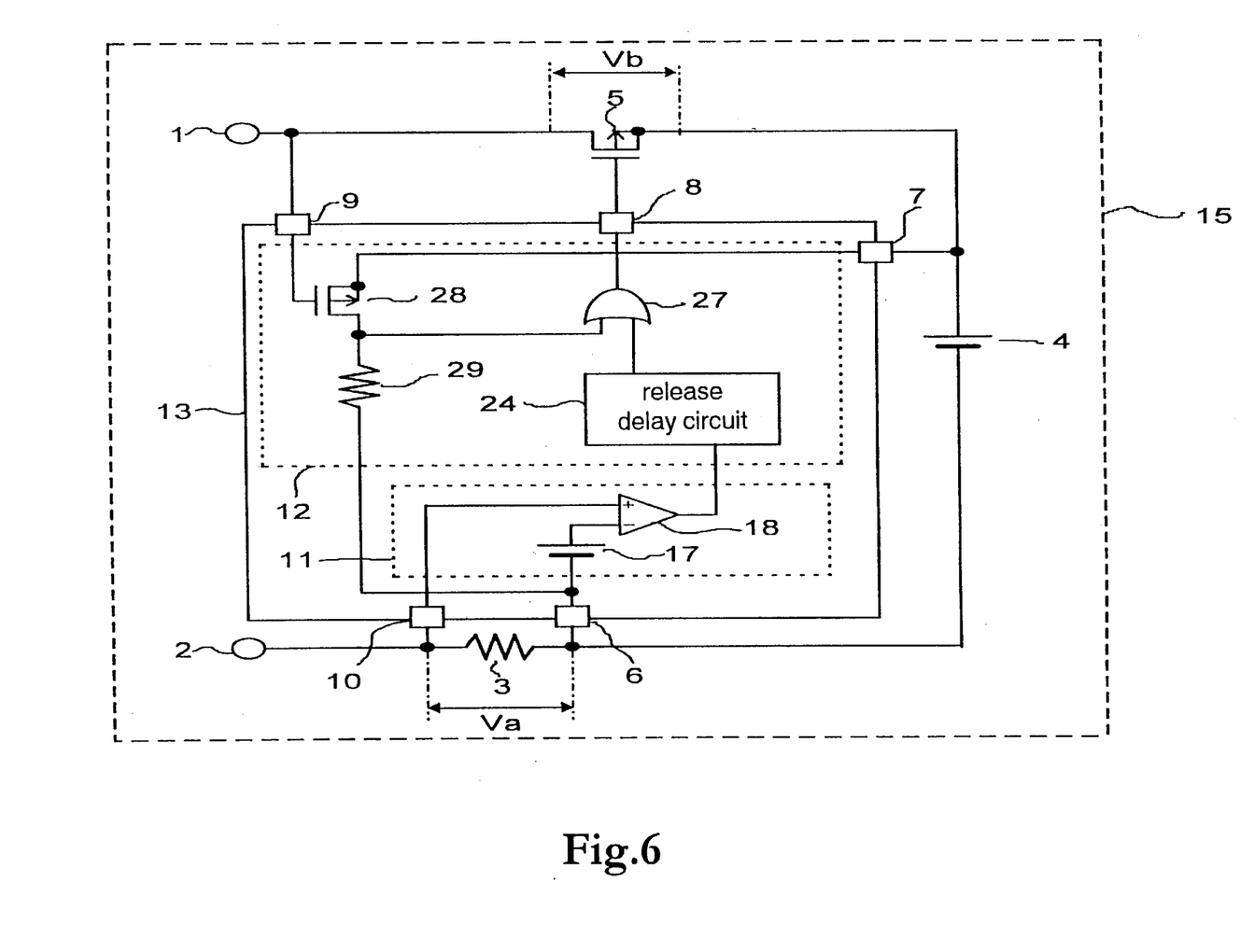
FIG. 6 is a structural circuit diagram showing a battery state monitoring circuit and a battery device using a transistor and a resistor for detection of the off-state of the switching element in accordance with the present invention.
Figure 7:
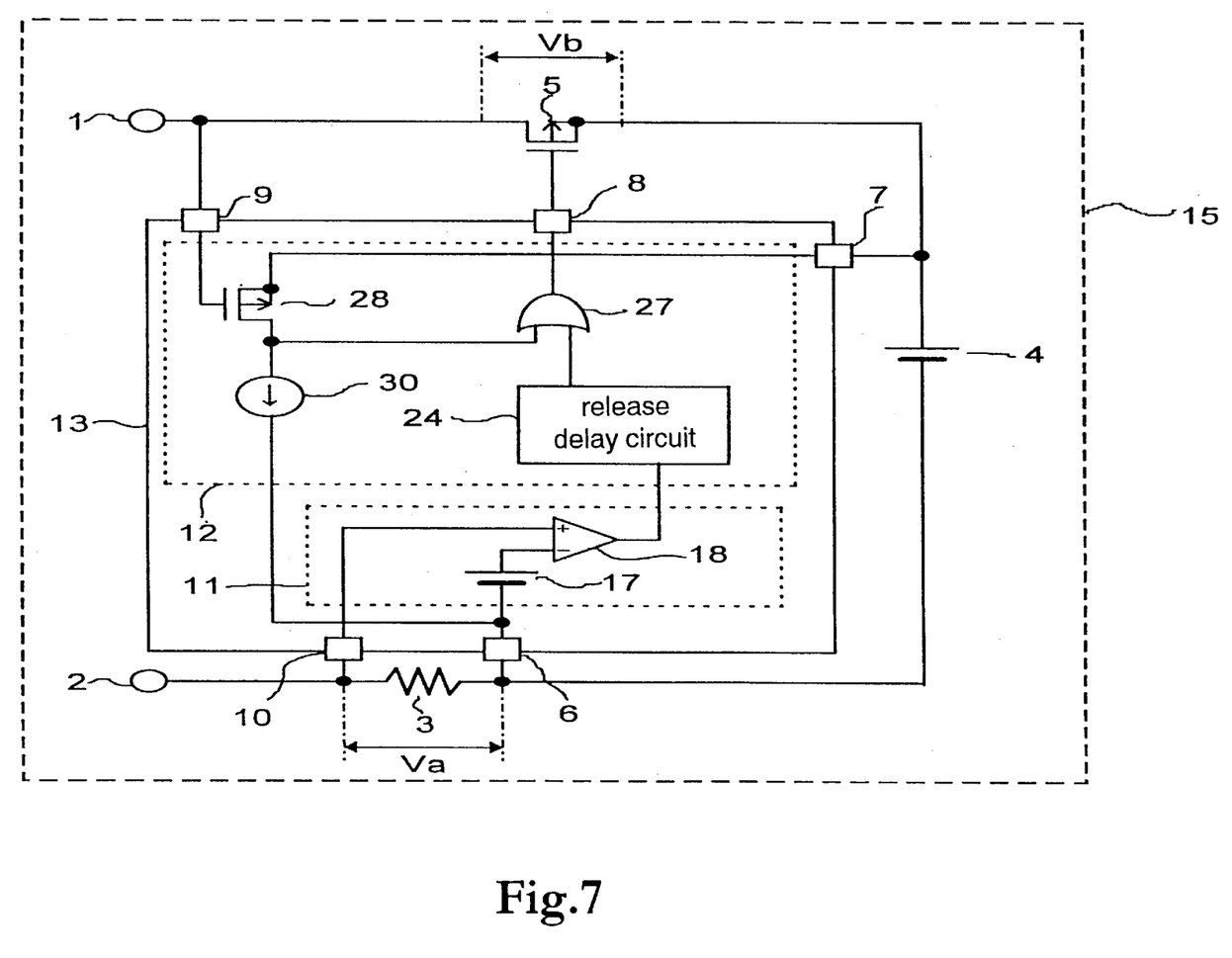
FIG. 7 is a structural circuit diagram showing a battery state monitoring circuit and a battery device using a transistor and a constant-current source for detection of the off-state of the switching element in accordance with the present invention.

In FIG. 5, the detection of the turn-off of the switching element 5 is conducted by the reference voltage 25 and the comparator 26. Alternatively, as shown in FIG. 6, the detection may be conducted with a transistor 28 and a resistor 29. In addition, as shown in FIG. 7, a constant-current source 30 may be used instead of the resistor shown in FIG. 6.

Further, in this embodiment, only the over-current detecting function was described among the various functions of the battery state monitoring circuit 13. Naturally, the battery state monitoring circuit for a lithium ion secondary battery or the like includes an over-charge control function, an over-discharge control function and so on in addition to the above function. However, their description was omitted in this embodiment.

The foregoing description of the preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A battery state monitoring circuit, comprising:
   means for detecting a voltage across a sense resistor and generating a corresponding detection signal; and
   means for holding the detection signal comprising means for delaying a release operation of the detection signal and means for detecting if at least one switching element for controlling charging/discharging of a battery has been operated to terminate a current flowing in the battery.

2. A battery device, comprising:

a rechargeable battery;

a sense resistor connected to the battery;

means for detecting a voltage across the sense resistor and generating a corresponding detection signal;

means for holding the detection signal; and at least one switching element for controlling a charging/discharging current of the battery in response to the detection signal;

wherein the means for holding the detection signal comprises means for delaying a release operation of the detection signal and means for detecting if the at least one switching element for controlling the charging/discharging current of the battery has been operated to terminate a current flowing the battery.

3. A battery pack comprising: a rechargeable power source; external connection terminals for connecting the rechargeable power source to at least one of a load and a charger; a switching element for terminating a current flowing in the power source; and a battery state monitoring circuit for detecting at least one of a voltage and a current of the power source and producing a corresponding output signal, the battery state monitoring circuit having an overcurrent detection circuit for detecting an overcurrent state of the power source and controlling the switching element to terminate current flow in the power source when an overcurrent state is detected, the overcurrent detection circuit comprising a sense resistor not formed of a transistor element connected in series with the power source for producing a voltage drop thereacross proportional to the current in the power source, and a comparator for comparing the voltage drop across the resistor to a reference voltage and producing a comparison output signal, the reference voltage being set to a value at which the voltage drop across the resistor indicates an overcharge state of the power source.

4. A battery pack according to claim 3; wherein the battery state monitoring circuit further comprises a delay circuit for delaying the comparison output signal and producing a delayed output signal and a latch circuit for latching the delayed output signal.

5. A battery pack according to claim 4; wherein the; latch circuit comprises a second comparator for comparing a voltage across the switching element to a second reference voltage to detect turning off of the switching element, and an OR gate for inputting the delayed output signal and the output signal of the second comparator and producing a signal for controlling the on/off state of the switching element.

6. A battery pack according to claim 3; wherein the rechargeable power source comprises one or more batteries.

7. A battery pack according to claim 3; wherein the battery state monitoring circuit further comprises an overcharge detecting circuit for detecting an overcharged state of the power source and an overdischarge detecting circuit for detecting an overdischarged state of the power source.

8. A battery device comprising: a rechargeable battery; a sense resistor not formed of a transistor connected to the battery; a switching element for terminating a current flowing in the battery; a circuit for detecting a voltage across the sense resistor and generating a detection signal for controlling the on/off state of the switching element so that when the voltage across the sense resistor is above a level indicating an overcurrent state of the battery the switching element is activated to terminate the current flowing in the battery; and means for holding the detection signal so that termination of current flow in the battery and a corresponding change in the voltage across the sense resistor does not prematurely result in placing the switching element in a state which allows a current to flow in the battery.

9. A battery device according to claim 8; wherein the means for holding the detection signal comprises means for delaying a release operation of the detection signal and means for detecting if the switching element for controlling the charging/discharging current of the battery has been operated to terminate a current flowing the battery.

10. A battery device according to claim 8; wherein the means for holding comprises a delay circuit for delaying the comparison output signal and producing a delayed output signal and a latch circuit for latching the delayed output signal.

11. A battery device according to claim 10; wherein the latch circuit comprises a comparator for comparing a voltage across the switching element to a reference voltage to detect turning off of the switching element, and an OR gate for inputting the delayed output signal and the output signal of the comparator and producing a signal for controlling the on/off state of the switching element.

* * * * *